United States Patent [19]
Iwakiri

[11] Patent Number: 6,130,126
[45] Date of Patent: Oct. 10, 2000

[54] SELF-PLANARIZING DRAM CHIP AVOIDS EDGE FLAKING

[75] Inventor: Takashi Iwakiri, Yamanasni, Japan

[73] Assignee: Texas Instruments Incorporated, Dallas, Tex.

[21] Appl. No.: 09/339,728

[22] Filed: Jun. 24, 1999

Related U.S. Application Data

[60] Provisional application No. 60/090,931, Jun. 26, 1998.

[51] Int. Cl.[7] ............................................... H01L 21/8242
[52] U.S. Cl. ..................... 438/253; 438/243; 438/396; 438/585; 438/437; 438/190
[58] Field of Search ..................... 438/253, 241, 438/254, 619, 585, 691, 67, 381, 255, 398, 396

[56] References Cited

U.S. PATENT DOCUMENTS

| | | | |
|---|---|---|---|
| 5,286,674 | 2/1994 | Roth et al. | 437/984 |
| 5,504,026 | 4/1996 | Kung | 437/51 |
| 5,578,523 | 11/1996 | Fiordalice et al. | 437/190 |
| 5,770,499 | 6/1998 | Kwok et al. | 438/253 |
| 5,807,775 | 9/1999 | Tseng | 438/253 |
| 5,880,018 | 5/1999 | Boeck et al. | 438/619 |
| 5,956,587 | 9/1999 | Chen et al. | 438/255 |
| 5,989,952 | 11/1999 | Jen et al. | 438/253 |
| 5,993,742 | 8/1999 | Wu | 438/398 |
| 5,998,260 | 12/1999 | Lin | 438/254 |
| 5,998,285 | 12/1999 | Chou | 438/585 |

*Primary Examiner*—Matthew Smith
*Assistant Examiner*—Belur Keshavan
*Attorney, Agent, or Firm*—Wade James Brady, III; Frederick J. Telecky, Jr.

[57] ABSTRACT

The dummy oxide used to form DRAM capacitor cells is left in place over the peripheral transistors, reducing the height difference between the DRAM array and the peripheral circuitry and protecting against edge effects.

12 Claims, 8 Drawing Sheets

SELF-PLANARIZING DRAM CHIP AVOIDS EDGE FLAKING

CROSS REFERENCE TO PRIOR APPLICATIONS

This application claims priority under 35 U.S.C. 119(e) based upon Provisional Application Ser. No. 60/090,931, filed Jun. 26, 1998.

BACKGROUND AND SUMMARY OF THE INVENTION

The present invention relates to integrated circuit structures and fabrication methods, especially to DRAM arrays. A block diagram of a DRAM array is shown in FIG. 8.

Background: Edge Problems in DRAM

Dynamic Random Access Memory (DRAM) cells have a capacitor buried under, or stacked over, the transistor associated with it. Where the capacitor is stacked over the transistor, the configuration can be divided into two types: the capacitor-under-bitline (CUB) and the capacitor-over-bitline (COB). One type of DRAM cell uses the crown capacitor as seen in FIG. 6. In this drawing, bitline contact 610 descends from bitline 600 to contact the bitline contact plug 620. Transistors include gates 630, which extend in places over the field oxide isolation (FOX). Crown capacitors rise over the transistors and include a storage node layer 31, a capacitor dielectric 32, and plate layer 34. Fabrication of the DRAM array includes formation of the transistor array, followed by deposition of a thick layer of dummy oxide, which provides a structure on which the storage nodes of the capacitors are formed. After the storage nodes are created, the oxide is removed, necessitating a long wet etch or vapor phase HF etch, followed by deposition of the dielectric and plate layers. One problem with this method is illustrated in FIGS. 4A–C, which show both the capacitor and the edge of the wafer. In FIG. 4A, the sacrificial oxide layer 410 is seen, overlain by a layer of conductive material 420 to form the electrode, while on the right side of the drawing, both the sacrificial layer and the conductive layer extend over the edge of the wafer. In FIG. 4B, the conductive material 420 is etched back to form the storage node while this etch at the wafer edge shows uneven performance, where artifact 425 of the conductive layer remains after the etch. In FIG. 4C, the sacrificial layer 410 is removed, leaving the electrode exposed for further processing, while at the edge, the removal of the sacrificial layer frees particles, such as artifact 425 or undercut pieces of the conductive layer. These particles formed during the etch can cause degradation of the circuit.

Background: Height Differences in Stacked DRAM Cells

In addition to the edge problem, the height of the capacitors causes a very severe topography difference between the cell array and peripheral areas. In some current processes being developed for crown arrays, cell capacitor height is in the range of 1,000 nm, while the photo-lithography process is limited to less than 400 nm of topography difference. Thus, there is a need to reduce the height difference in this process, preferably without adding process steps or process time, but generally accomplished by depositing a further dielectric. Additionally, high temperature processes are not useable because of the need to use a Ta2O5 film, or other high-K dielectric, to have enough capacitance, excluding such processes as BPSG reflow.

Co-pending Planarizing Application

U.S. Pat. No. 5,770,499, which is co-pending with the current application, addresses the height difference, as seen in FIGS. 5A–B. In FIG. 5A, a layer of dielectric 170, e.g. BPSG, is deposited over the wafer, including dielectric 110, which covers the completed transistors (not shown). A protective layer of nitride 172 is then deposited and patterned to act as a hard mask. Dielectric 170 is then removed in the area of the DRAM array to form cavity 180. Storage node contacts 116 are formed, then cavity 180 is filled with alternating layers of polysilicon which are doped to have different etch characteristics. When these polysilicon layers are selectively etched, they form storage nodes 136, which are then covered with capacitor dielectric 120 and plate layer 122. The original dielectric 170, which was left in place over the peripheral regions, is chosen to have a thickness which corresponds to the height of the finished capacitors.

Self-Planarized DRAM Without Edge Flaking

This application discloses that when a dummy oxide is used in the formation of the capacitors, it can be left in peripheral areas by forming a "guard wall" to separate the array from the rest of the chip. The oxide outside the array is covered by a protective layer and remains in place during formation of the capacitors and removal of the dummy oxide. The protective layer is continuous over the wafer edge, covering and protecting those areas where the conductive material is subject to flaking, as well as providing a much more even topography.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Primary Embodiment: Capacitor-Under-Bitline DRAM

Figure 3:
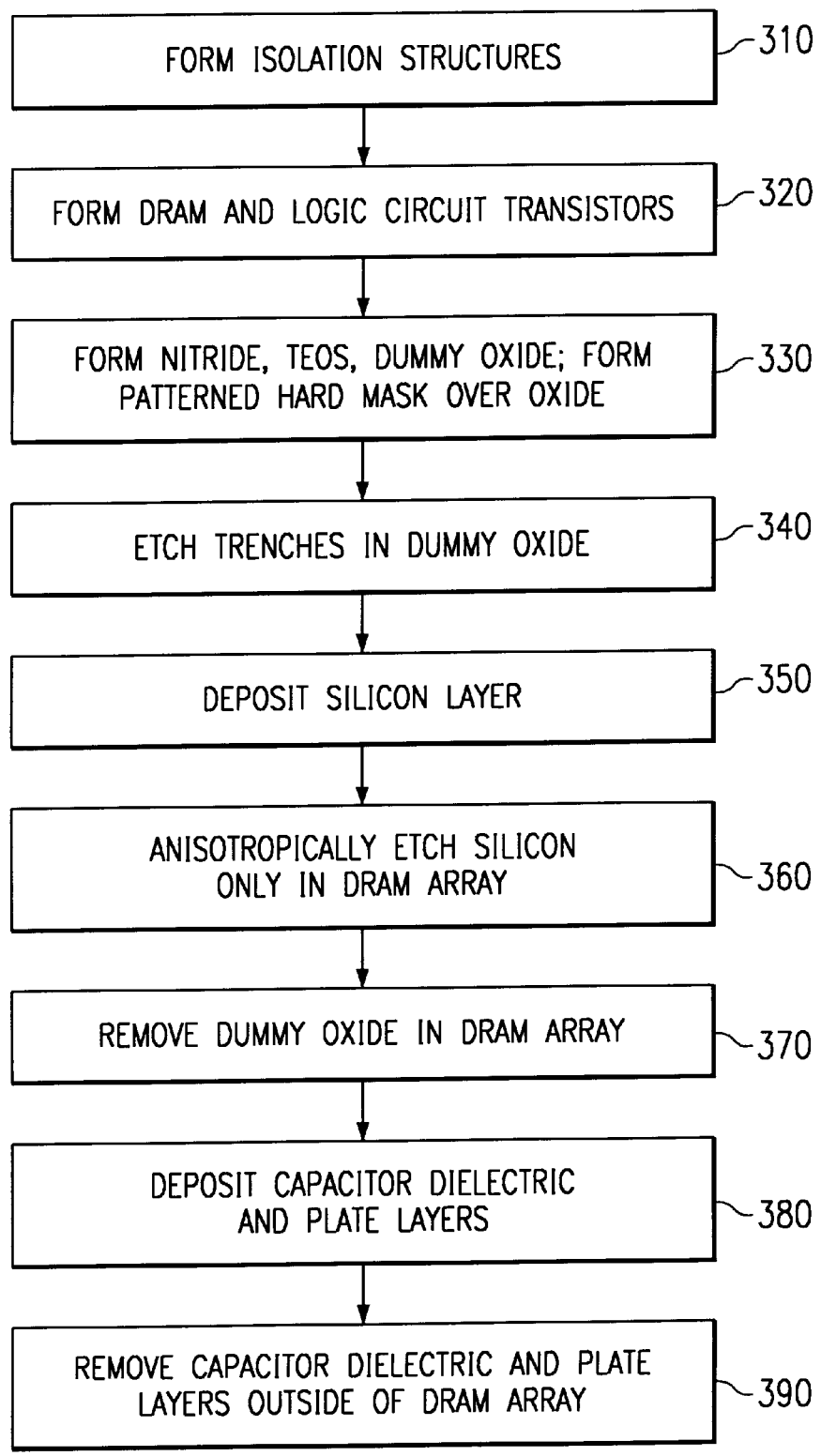
FIG. 3 is a flow chart showing key steps in the formation of the capacitor array.
Figure 4A:
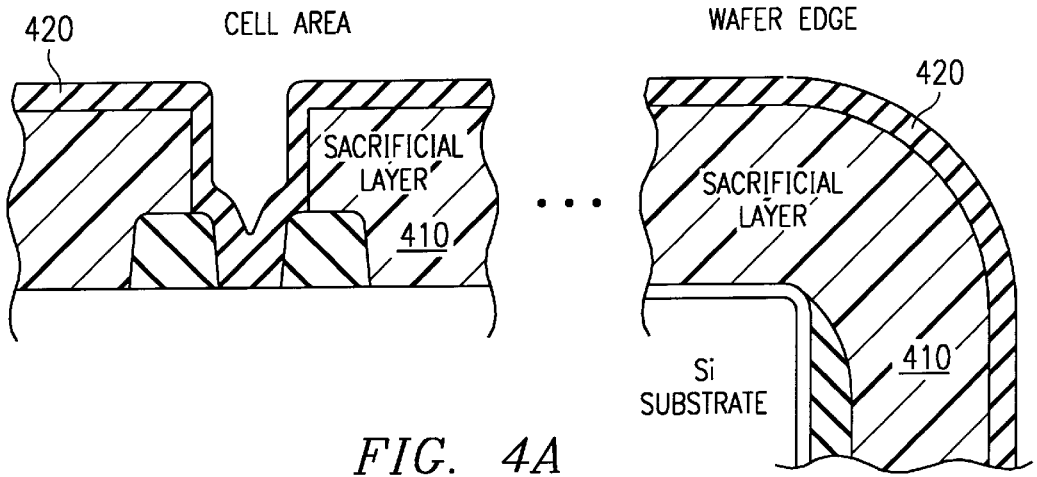
FIGS. 4A–C show a prior art method of formation of a crown cell, as well as the edge of the wafer during the same steps, demonstrating the formation of particles during the etch.
Figure 4B:
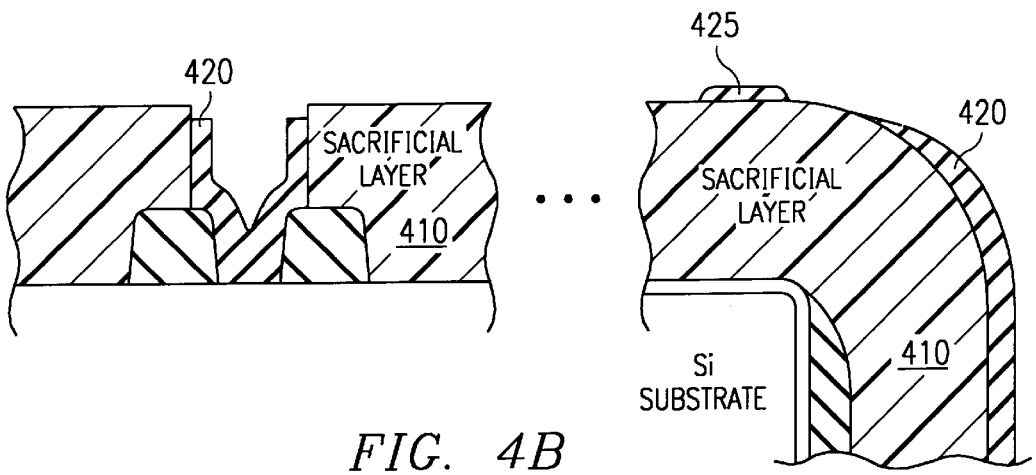
Figure 4C:
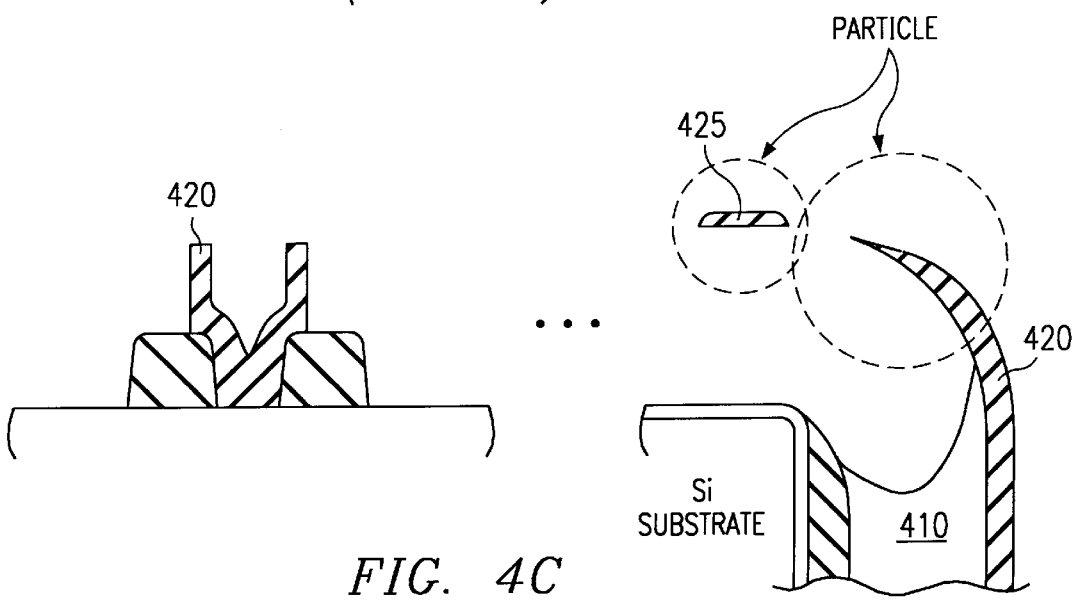
Figure 5A:
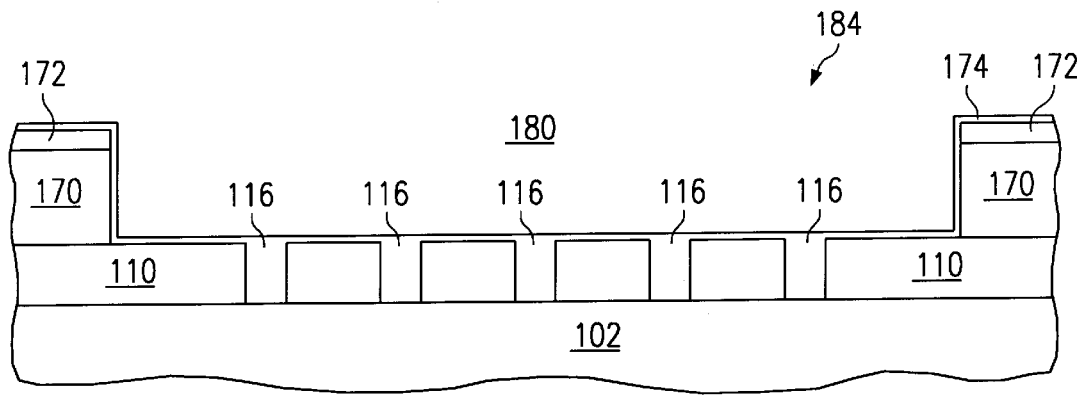
FIGS. 5A–B show a method of planarizing a chip containing a capacitor array.
Figure 5B:
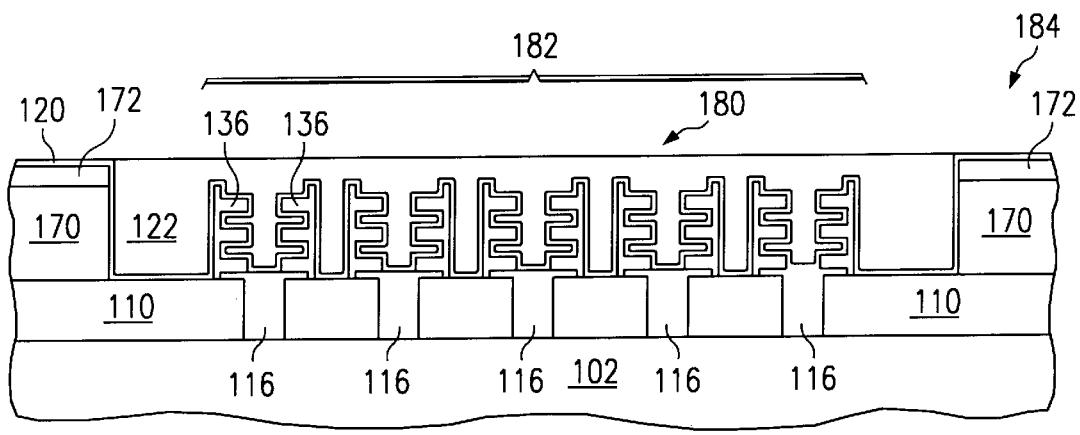
Figure 6:
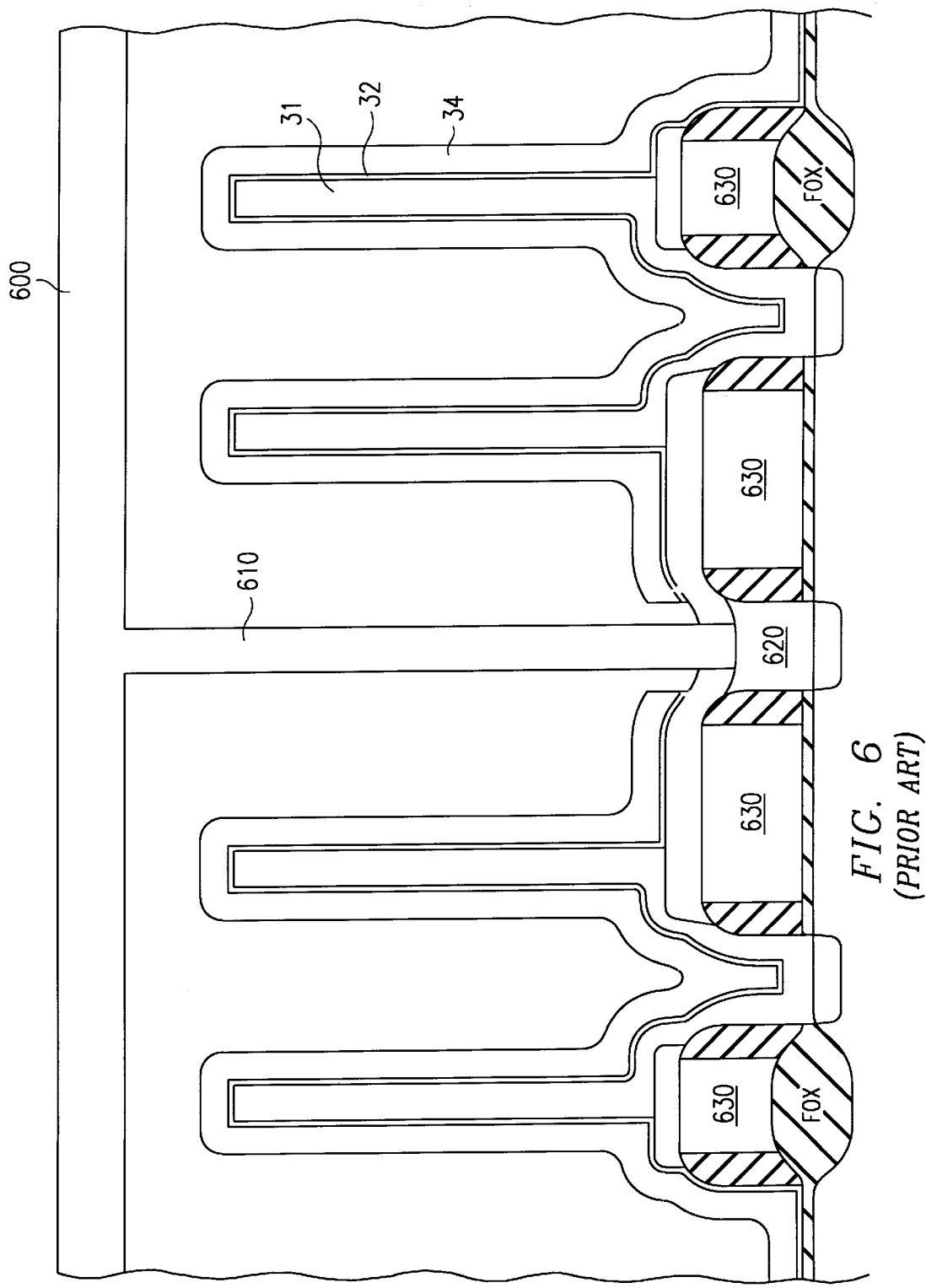
FIG. 6 shows an example of a capacitor-under-bitline DRAM cell which uses a crown capacitor.
Figure 8:
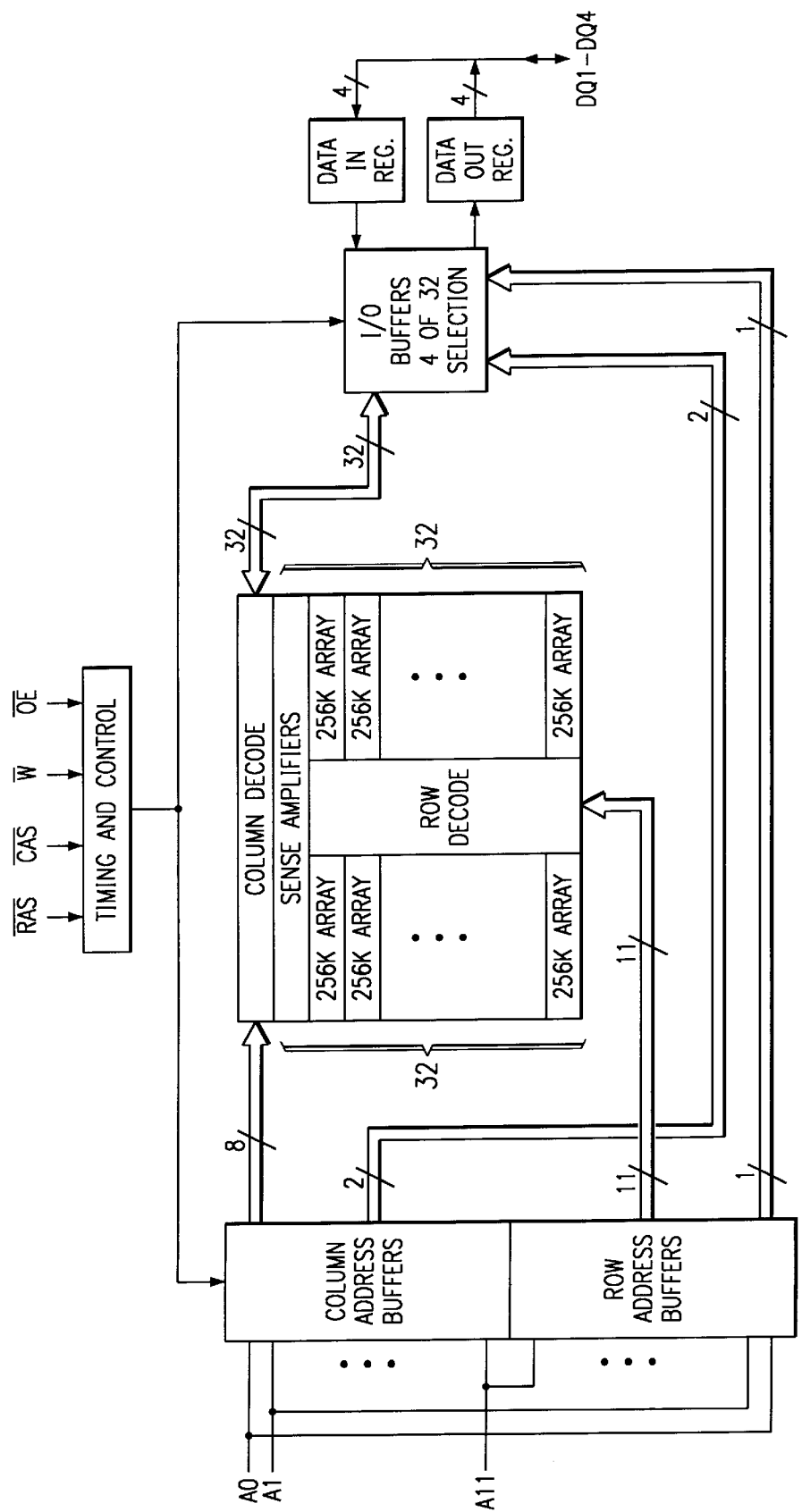
FIG. 8 shows a block diagram of a DRAM array.

The disclosed process was developed for a crown cell used in a capacitor-under-bitline architecture, and will be discussed with reference to FIG. 3, which shows a flowchart for including the process in the fabrication of a crown cell array and to FIGS. 1A–G, which demonstrate the fabrication of the capacitor layer. FIGS. 1A–G are a simplification of the array seen in FIG. 6, and show only the capacitor level. Prior to the formation of the capacitors, isolation structures are formed (step 310), transistors are created (step 320), and an interlevel dielectric 10 is deposited.

Figure 1A:
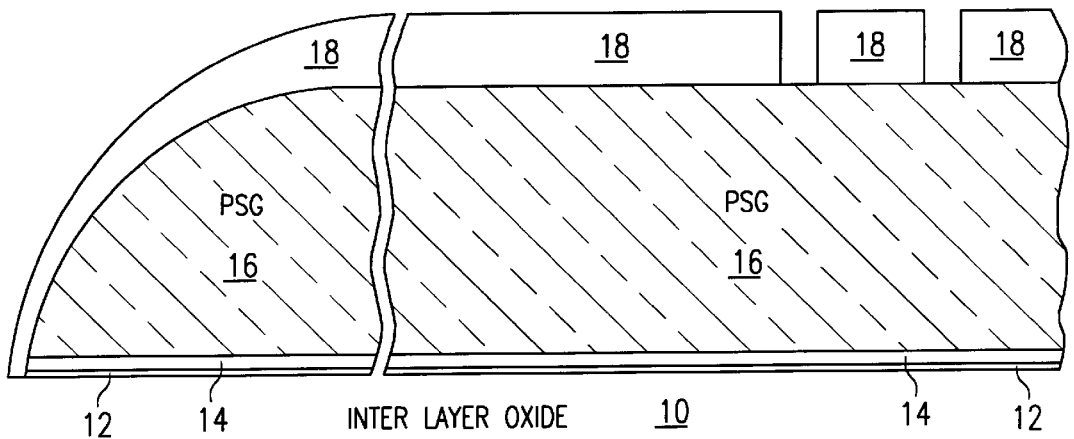
FIGS. 1A–1G show a cross-section of a partially fabricated DRAM array during formation of the capacitors.
Figure 1B:
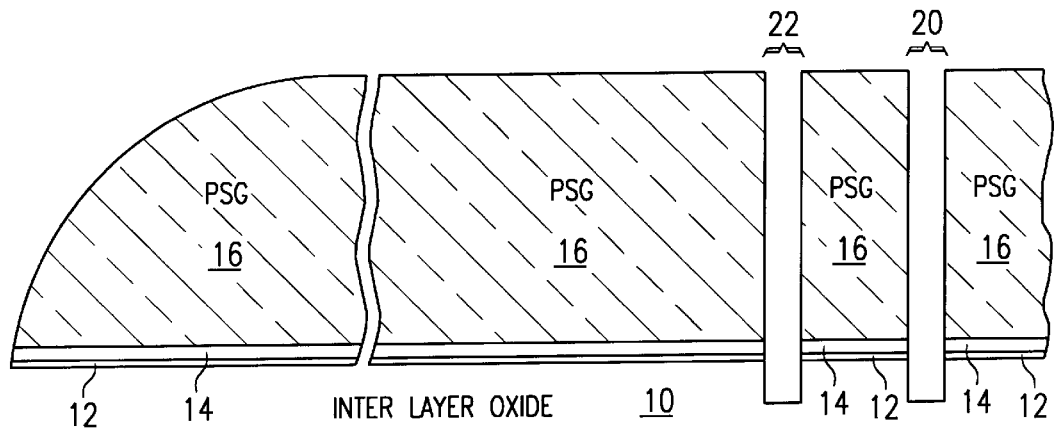

As seen in FIG. 1A, layer of silicon nitride 12, approximately 40 nm thick, is deposited to serve as an etch stop, followed by deposition of 200 nm of TEOS 14. A thick layer of phosphosilicate glass (PSG) 16 is then deposited to a depth of approximately 700 nm. A layer of polysilicon 18, approximately 200 nm thick, is deposited and patterned to serve as a hard mask (step 330).

Using the hard mask, the PSG is etched in the areas where capacitors are desired, to form trenches 20 on which the capacitor storage nodes can be formed. Additionally, a trench 22 is etched (step 340) around the entire DRAM array, to serve as the guard wall. This etch uses known methods to etch through the PSG, TEOS and nitride layers to stop in the underlying oxide layer 10. The polysilicon hardmask 18 is then removed, giving the structure seen in FIG. 1B.

Figure 1C:
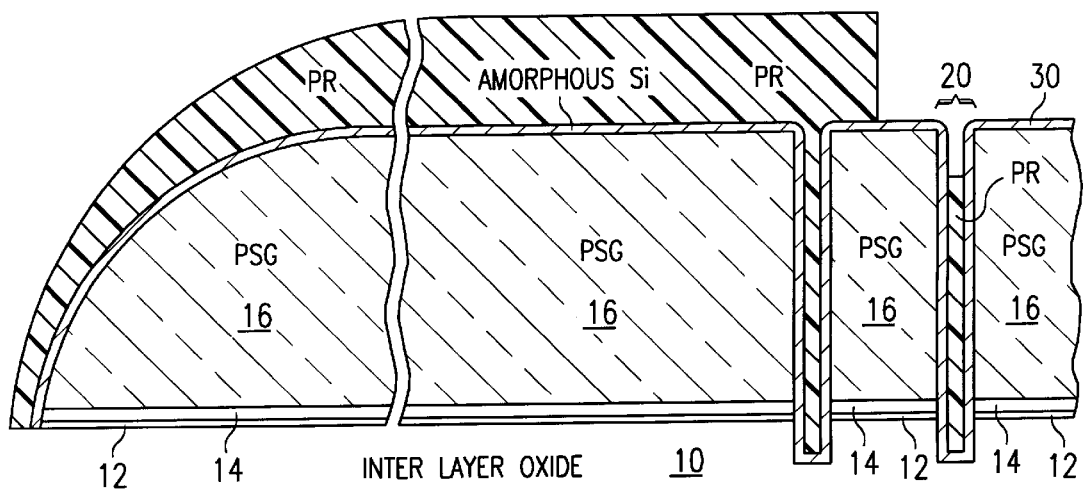

A conformal layer of amorphous silicon 30 is deposited (step 350) to a depth of about 40 nm. A layer of photo-resist is patterned as the CUB pattern to expose only the areas of the DRAM array, as seen in FIG. 1C.

Figure 1D:
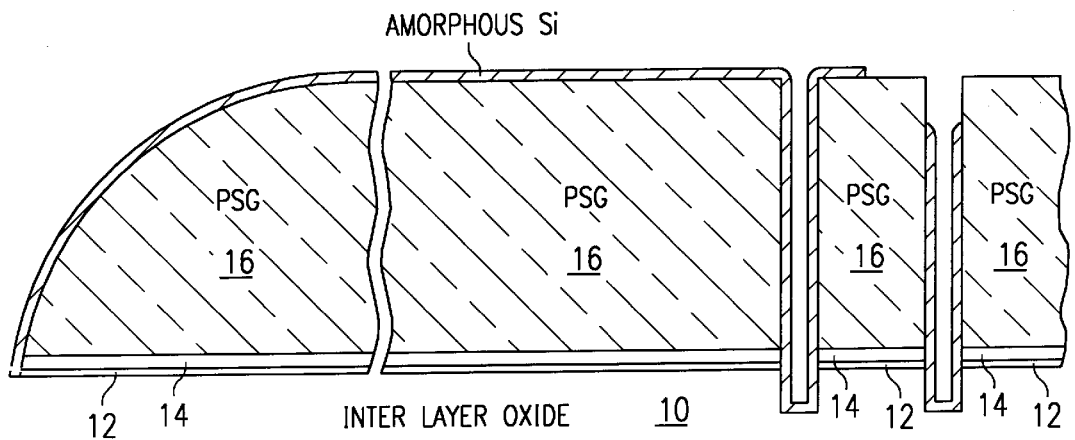

The amorphous silicon is then etched back (step 360) within the array, clearing the uppermost surfaces. Once the photo-resist is removed, the edge of the array appears as seen in FIG. 1D.

Figure 1E:
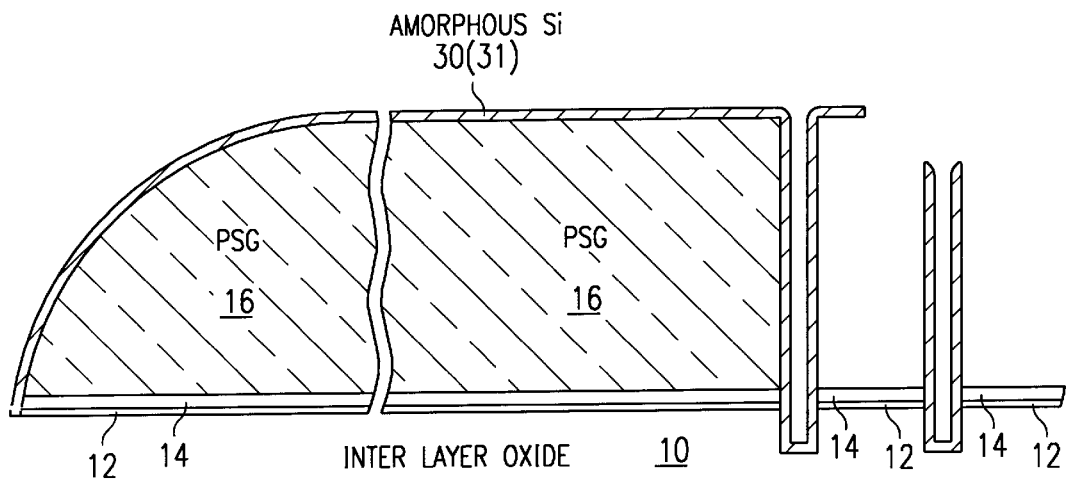

The PSG 16 in the array area is then stripped (step 370), using a vaporous HF, leaving the amorphous silicon 30, which will be converted to polysilicon 31, to form the capacitor storage node seen in FIG. 1E. Since the PSG outside of the array is protected by the layer of amorphous silicon, this PSG is not removed.

Figure 1F:
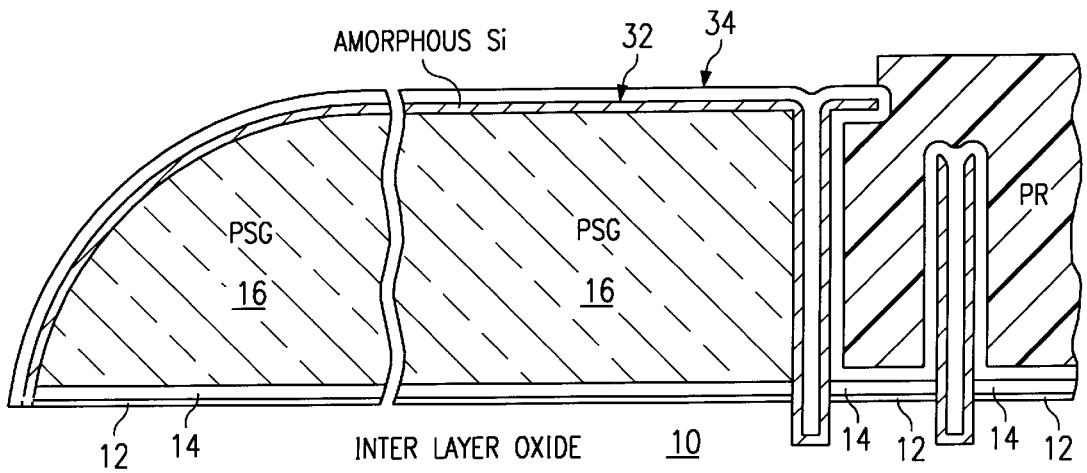

Processing of the capacitors continues (step 380) with the formation of the capacitor dielectric, e.g. 8 nm of Ta2O5 32 (shown only as a line because of thinness), and deposition of 70 nm of TiN to form the conductive plate layer 34, seen in FIG. 1F. Note that a mask is not used for this step, so these layers will also form over the peripheral areas of the circuit.

Figure 1G:
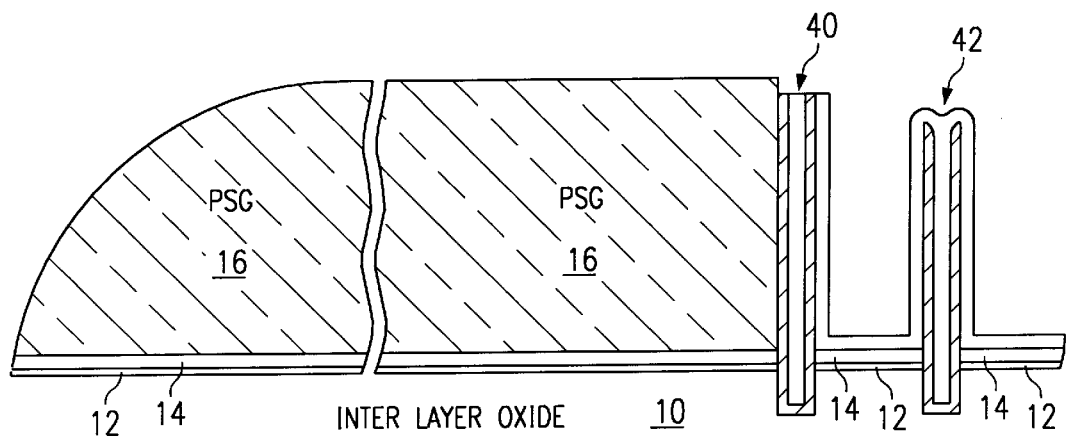

In order to remove unwanted portions of layers 30, 32, and 34, a protective resist layer, which is patterned as the inverse of the CUB pattern, is used (step 390) to etch the TiN, Ta2O5, and amorphous silicon layers which are not in the array area, giving the guard wall 40 and capacitor 42 shown in FIG. 1G. Of importance in this figure, is the fact that even if the removal of the silicon is uneven at the edges, remaining portions of the silicon will still be bound to the underlying oxide layer, and so will not cause particle contamination from the edge. Alternative to the patterned etch of step 390, it may be possible to deposit the photo-resist and etchback the resist so that a sufficient depth exists over the capacitors, but no resist remains outside the array, allowing the deletion of a mask from the process.

Figure 2:
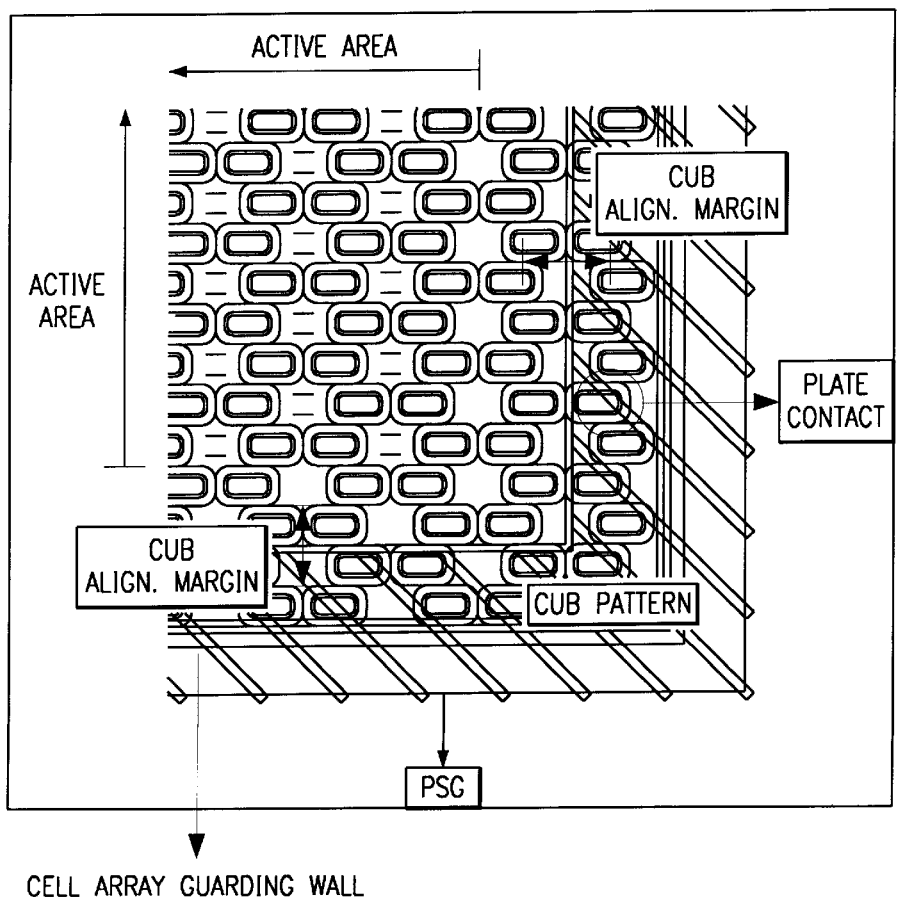
FIG. 2 shows an "overhead" view of the array, showing the guarding wall.

FIG. 2 shows an "overhead" view of the DRAM array. This view is of the edge of the array, with active capacitors 42 in the top left area, while peripheral circuitry extends below and to the right of the area shown. Guard wall 40 encloses the array, with non-functional capacitors lying adjacent the wall to allow for alignment errors.

Alternate Embodiment: Double Crown Cell

Figure 7:
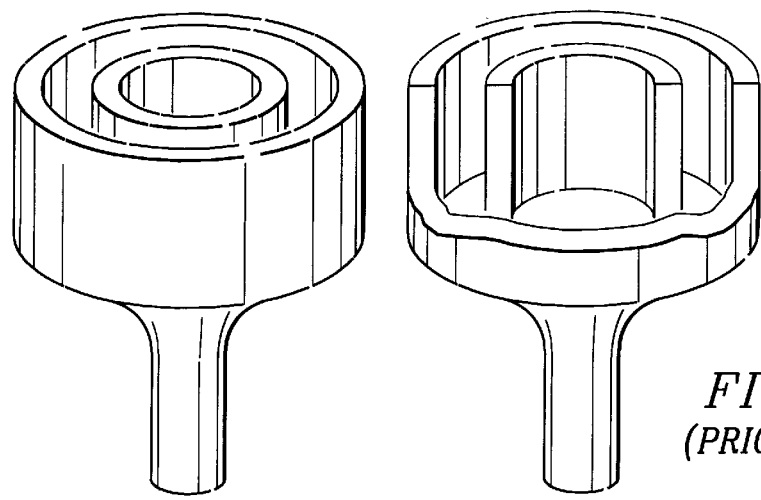
FIG. 7 shows an example of a double crown capacitor.

In an alternate embodiment, the crown cells formed are double crowns, an example of which is seen in FIG. 7.

Alternate Embodiment: Polysilicon for Plate Layer

In a further alternate embodiment, the conductive plate layer is formed of a thin layer of polysilicon. Other parameters remain the same.

Alternate Embodiment: SiOxNy as Capacitor Dielectric

In a further alternate embodiment, capacitor dielectric 118 can be formed of a thin layer of SiOxNy. Other parameters remain the same.

Alternate Embodiment: SiGe or SiGeC for Storage Node

In an alternate embodiment, the storage node is formed of polysilicon germanium or, alternatively, polysilicon germanium carbide. Other parameters remain the same.

Alternate Embodiment: Capacitor-Over-Bitline DRAM

Although the invention has been described in the context of a CUB architecture, it can also be used with a Capacitor-Over-Bitline (COB) architecture, where the bitline is formed prior to deposition of the sacrificial oxide.

According to a disclosed class of innovative embodiments, there is provided: A fabrication method, comprising the step of forming a memory array including crown cell capacitors, while maintaining a layer of dielectric which extends up to the height of said capacitors in areas outside said memory array.

According to another disclosed class of innovative embodiments, there is provided: A fabrication method, comprising the step of forming a memory array on a wafer having rounded edges, using a process which includes removal of a sacrificial dielectric from a vertically extended capacitor structure while maintaining the thickness of said dielectric in at least some areas outside said memory array, including at least some portions of said rounded edges.

According to another disclosed class of innovative embodiments, there is provided: A fabrication method for a DRAM array, comprising the steps of: (a.) forming a first plurality of transistors and a second plurality of transistors in a body of semiconductor material; (b.) forming a layer of dielectric which overlies both said first and said second pluralities of transistors; (c.) forming a plurality of storage nodes which are associated with said first plurality of transistors, said layer of dielectric providing at least one surface on which said storage nodes are formed; (d.) after said step of forming said plurality of storage nodes, at least partially removing said layer of dielectric over said first plurality of transistors, but not over said second plurality of transistors.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Although the invention has been disclosed in terms of chips containing COB and CUB DRAM arrays, it can be applied to other vertically extended DRAM designs, i.e. DRAMs using a capacitor which extends upward from a bottom contact, or a capacitor which includes vertical capacitor portions, or a capacitor which has an effective capacitor area which is more than twice as great as the footprint of the capacitor.

What is claimed is:

1. A method of fabricating a DRAM array comprising the steps of:

provSiding a region of semiconductor material having a plurality of transistors disposed therein;

providing a dielectric over said region of semiconductor material having a first isolating trench with sidewalls extending entirely through said dielectric and into said region of semiconductor material and surrounding said plurality of transistors and a plurality of second trenches with sidewalls extending into said dielectric, each said second trench associated with a different one of said transistors;

conformally depositing a layer of silicon on the surface of said dielectric including the sidewalls of said plurality of trenches and the first isolation trench;

removing said layer of silicon from said surface within said first isolating trench and at most partially into said plurality of second trenches;

then removing said dielectric disposed within said first isolating trench; and completing fabrication of a capacitor in each of said second trenches.

2. The method of claim 1 wherein said step of completing fabrication of a capacitor in each of said second trenches includes the steps of forming an electrically insulating layer over the layer of silicon in said second trenches and forming a layer of electrically conductive material over said electrically insulating layer in said second trenches.

3. The method of claim 2 wherein said second trenches extend entirely through said dielectric and into said region of semiconductor material.

4. The method of claim 3 wherein said layer of silicon is amorphous silicon and further including the step of converting said amorphous silicon to crystalline silicon.

5. The method of claim 4 wherein said step of converting said amorphous silicon to crystalline silicon is provided after removal of said dielectric.

6. The method of claim 2 wherein said layer of silicon is amorphous silicon and further including the step of converting-said amorphous silicon to crystalline silicon.

7. The method of claim 6 wherein said step of converting said amorphous silicon to crystalline silicon is provided after removal of said dielectric.

8. The method of claim 1 wherein said second trenches extend entirely through said dielectric and into said region of semiconductor material.

9. The method of claim 8 wherein said layer of silicon is amorphous silicon and further including the step of converting said amorphous silicon to crystalline silicon.

10. The method of claim 9 wherein said step of converting said amorphous silicon to crystalline silicon is provided after removal of said dielectric.

11. The method of claim 1 wherein said layer of silicon is amorphous silicon and further including the step of converting said amorphous silicon to crystalline silicon.

12. The method of claim 11 wherein said step of converting said amorphous silicon to crystalline silicon is provided after removal of said dielectric.

* * * * *